(12) United States Patent
Thomann (10) Patent No.: US 6,201,751 B1
(45) Date of Patent: Mar. 13, 2001

(54) INTEGRATED CIRCUIT POWER-UP CONTROLLERS, INTEGRATED CIRCUIT POWER-UP CIRCUITS, AND INTEGRATED CIRCUIT POWER-UP METHODS

(75) Inventor: Mark R. Thomann, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/264,462

(22) Filed: Mar. 8, 1999

(51) Int. Cl.$^7$ ........................................................ G11C 7/00
(52) U.S. Cl. ................ 365/226; 365/189.07; 365/189.11
(58) Field of Search ................................... 365/226, 194, 365/189.11, 189.07

(56) References Cited

U.S. PATENT DOCUMENTS

| | | | |
|---|---|---|---|
| 4,901,283 | * 2/1990 | Hanbury et al. | 365/222 |
| 5,517,137 | * 5/1996 | Stephens, Jr. | 326/93 |
| 5,544,124 | 8/1996 | Zagar et al. | 365/230.08 |
| 5,557,579 | * 9/1996 | Raad et al. | 365/226 |
| 5,586,077 | * 12/1996 | Olivio et al. | 365/226 |
| 5,666,321 | 9/1997 | Schaefer | 365/233.5 |
| 5,749,086 | 5/1998 | Ryan | 711/105 |
| 5,751,656 | 5/1998 | Schaefer | 365/233.5 |
| 5,889,719 | * 3/1999 | Yoo et al. | 365/226 |
| 5,898,635 | * 4/1999 | Raad et al. | 365/226 |
| 5,986,959 | * 11/1999 | Itou | 365/226 |

* cited by examiner

Primary Examiner—Richard Elms
Assistant Examiner—Hien Nguyen
(74) Attorney, Agent, or Firm—Wells, St. John, Roberts, Gregory & Matkin, P.S.

(57) ABSTRACT

Integrated circuit power-up controllers, integrated circuit power-up circuits, and integrated circuit power-up methods are described. In one embodiment, first and second circuits are provided each having their own outputs. A state-dependent, power-up control circuit includes two inputs which are coupled respectively with the outputs of the first and second circuits. The state-dependent, power-up control circuit is configured to initiate power-up of a desired circuit after a predetermined state has been achieved at the two inputs. In another embodiment, a delay circuit is provided and configured to provide a delayed output. An input circuit is provided having an output. A power-up control circuit has inputs which are coupled respectively with the outputs of the delay circuit and the input circuit. The power-up control circuit has an output line which can assume a plurality of power-up states. A feedback control loop is operatively connected with the power-up control circuit output line and the input circuit for controlling operational aspects of the input circuit responsive to power-up states achieved by the power-up control circuit. In a preferred embodiment, logic circuitry is provided for controlling the power-up states of the power-up circuit.

37 Claims, 7 Drawing Sheets

INTEGRATED CIRCUIT POWER-UP CONTROLLERS, INTEGRATED CIRCUIT POWER-UP CIRCUITS, AND INTEGRATED CIRCUIT POWER-UP METHODS

TECHNICAL FIELD

This invention relates to integrated circuit power-up controllers, to integrated circuit power-up circuits, and to integrated circuit power-up methods. The invention is particularly useful in the context of double data rate (DDR) synchronous dynamic random access memory (DRAM) devices.

BACKGROUND OF THE INVENTION

Integrated circuit devices must typically be powered up when operation is initiated. During power-up of an integrated circuit, certain operational parameters must generally be maintained and managed if the integrated circuit is to operate properly after power-up. Power-up can typically involve application of a voltage $V_{DD}$ to the circuit.

One special type of circuit is a double data rate (DDR) synchronous DRAM. Synchronous DRAMs are described generally in U.S. Pat. Nos. 5,751,656, 5,749,086, 5,666,321, and 5,544,124, assigned to the assignee of this disclosure, and incorporated by reference herein. Typically with such devices, it is desirable to maintain the control pin CKE at a first value during application of a voltage, $V_{DD}$, to the circuit. After the circuit has stabilized, and a number of conditions have been met for a period of time, typically 200 microseconds, then CKE must be taken to an input above its first value (e.g. 2 volts). If CKE is taken to an input above its first value prior to the allotted time, circuit operations downstream of power-up can be affected.

Figure 1:
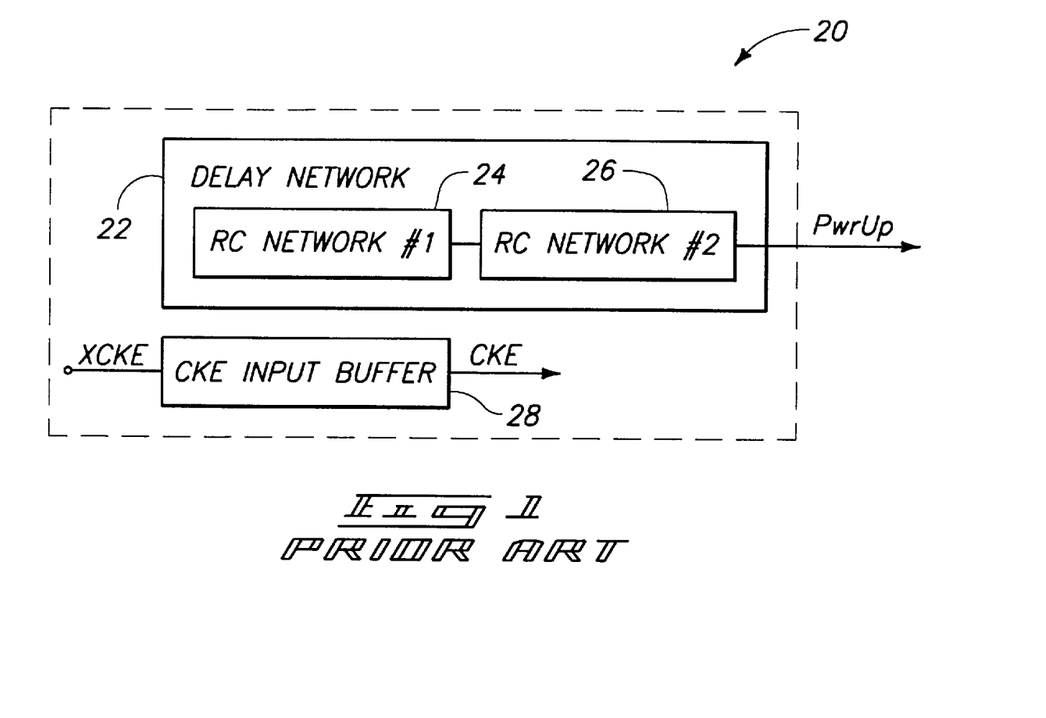
FIG. 1 is a high level schematic diagram of a circuit in accordance with the prior art.

One typical prior art way of achieving a desired delay before moving CKE to its desired input, is illustrated by the high level circuit diagram shown in FIG. 1 generally at 20. Circuit 20 includes a delay network 22. Delay network 22, in the past, has comprised first and second RC networks 24, 26, respectively. Essentially, delay network 22 powers-up in accordance with a predetermined delay which is appropriate for enabling certain conditions to be met, e.g. stable power, stable clock, and no operation conditions. A CKE input buffer 28 is provided whose output, CKE, can be taken to its desired voltage after the delay of delay network 22 has been achieved. There are, however, problems associated with the use of a delay network such as delay network 22. Such networks can be unpredictable insofar as performance of the individual RC networks 24, 26, respectively. Specifically, if the delay, for whatever reason, is not adequately long enough, then power-up can be prematurely set off which has downstream implications insofar as circuit operation is concerned.

Accordingly, this invention arose out of concerns associated with providing improved power-up controllers and circuitry, as well as improved power-up methods for integrated circuitry. In particular, this invention arose out of concerns associated with providing improved power-up controllers and circuitry, as well as improved power-up methods for use in connection with dynamic random access memory circuitry.

SUMMARY OF THE INVENTION

Integrated circuit power-up controllers, integrated circuit power-up circuits, and integrated circuit power-up methods are described. In one embodiment, first and second circuits are provided each having their own outputs. A state-dependent, power-up control circuit includes two inputs which are coupled respectively with the outputs of the first and second circuits. The state-dependent, power-up control circuit is configured to initiate power-up of a desired circuit after a predetermined state has been achieved at the two inputs. In another embodiment, a delay circuit is provided and configured to provide a delayed output. An input circuit is provided having an output. A power-up control circuit has inputs which are coupled respectively with the outputs of the delay circuit and the input circuit. The power-up control circuit has an output line which can assume a plurality of power-up states. A feedback control loop is operatively connected with the power-up control circuit output line and the input circuit for controlling operational aspects of the input circuit responsive to power-up states achieved by the power-up control circuit. In a preferred embodiment, logic circuitry is provided for controlling the power-up states of the power-up circuit.

BRIEF DESCRIPTION OF THE DRAWINGS

Preferred embodiments of the invention are described below with reference to following accompanying drawings.

FIG. 13 is a somewhat schematic diagram of an integrated circuit power-up circuit in accordance with a preferred embodiment of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 2:
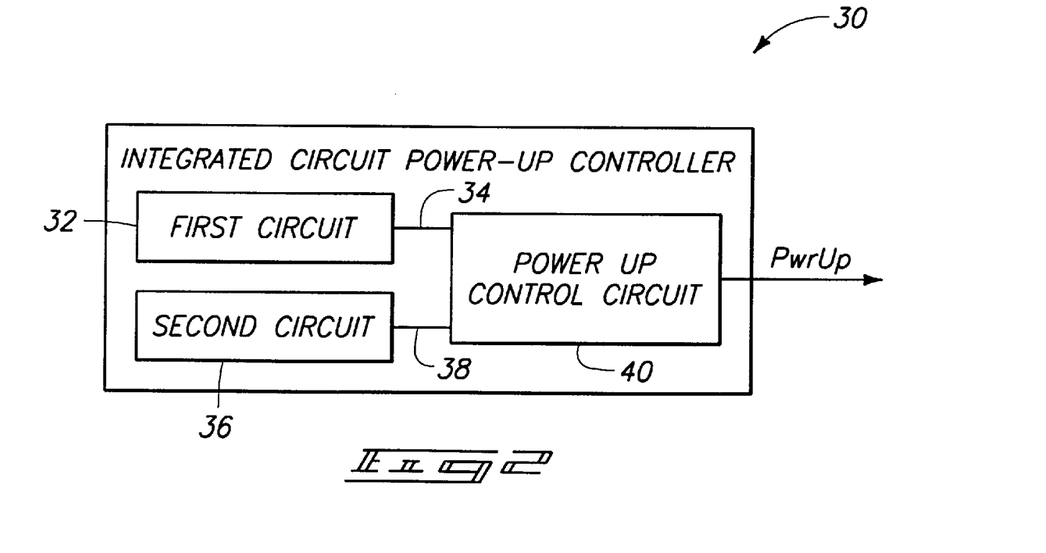
FIG. 2 is a high level block diagram of an integrated circuit power-up controller in accordance with one embodiment of the invention.

Referring to FIG. 2, an integrated circuit power-up controller in accordance with one embodiment of the invention is shown generally at 30 and includes a first circuit 32 having an output 34. A second circuit 36 is provided having an output 38. A state-dependent, power-up control circuit 40 is provided having two inputs which are coupled respectively with outputs 34, 38 of first and second circuits 32, 36 respectively. The state-dependent, power-up control circuit 40 is configured to initiate power-up of a desired integrated circuit after a predetermined state has been achieved at its two inputs. In this manner, operational conditions which are defined at outputs 34, 38 can be used to trigger power-up of the integrated circuit. This constitutes an improvement over the prior art, because there, power-up was initiated only after a predetermined delay was achieved. Such predetermined delays can, as pointed out above, be susceptible to operational irregularities which can cause premature initiation of circuit power-up. Here, by virtue of there being at least two inputs to the power-up control circuit, predefined conditions can be set before initiation of power-up.

In this example, first and second circuits 32, 36 respectively can comprise any circuits which are suitable for use, or suitably provided with the desired integrated circuitry of which the power-up controller 30 comprises a part. In a preferred embodiment, the integrated circuitry of which the power-up controller comprises a part comprises dynamic random access memory circuitry, and more particularly double data rate synchronous DRAMs.

Figure 3:
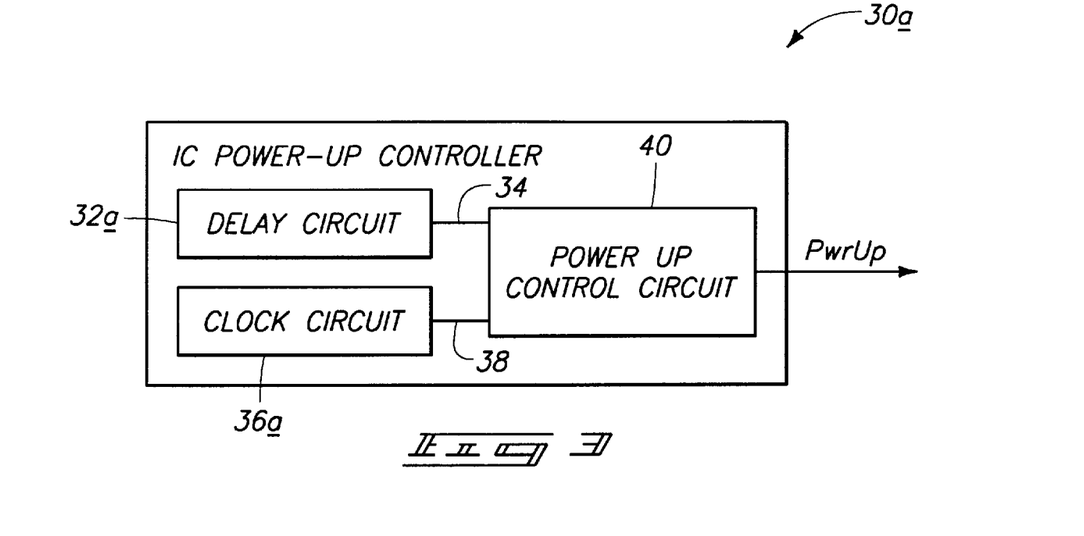
FIG. 3 is a high level block diagram of an integrated circuit power-up controller in accordance with another embodiment of the invention.

Referring to FIG. 3, an alternate embodiment of the present invention is shown generally at 30a. Like numerals from the above-described embodiment have been utilized where appropriate, with differences being indicated by the suffix "a" or with different numerals. Here, one of the first and second circuits comprises a delay circuit 32a, and the other of the first and second circuits comprises a clock circuit 36a. In this example, power-up is achieved by power-up control circuit 40 only when two conditions are met. The first condition is that the delay provided by delay circuit 32a has been achieved. The second condition is that the proper state of the clock circuit, i.e. CKE, is achieved.

Figure 4:
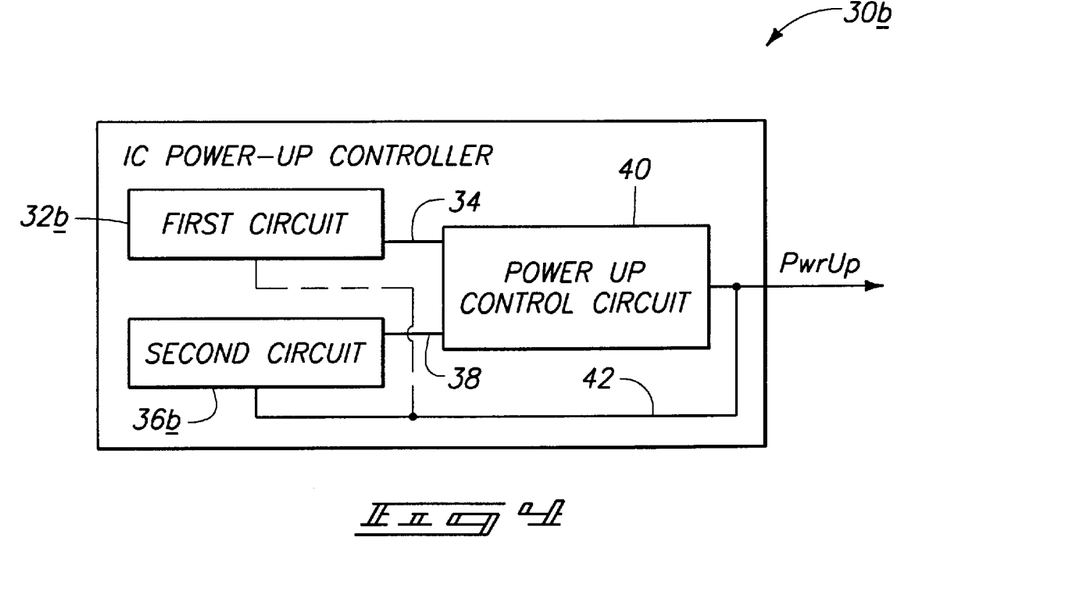
FIG. 4 is a high level block diagram of an integrated circuit power-up controller in accordance with another embodiment of the invention.

Referring to FIG. 4, an alternate embodiment of the present invention is shown generally at 30b. Like numerals from the above-described embodiment have been utilized where appropriate with differences being indicated by the suffix "b" or with different numerals. Here, first and second circuits 32b, 36b are provided as shown. Such circuits can, but need not, comprise a delay circuit and/or a clock circuit. In accordance with one embodiment of the invention, a feedback loop 42 is provided and operably couples power-up control circuit 40 with one of the first and second circuits 32b, 36b respectively. Such alternate coupling is indicated by the dashed line which extends from feedback loop 42 to first circuit 32b. Feedback loop 42 is preferably configured to affect certain operational aspects of the circuit with which it is coupled. In one embodiment, the operational aspects of the subject circuit are controlled by the power-up state present at the output of the power-up control circuit. Accordingly, the feedback loop provides an aspect of control over the circuit with which it is coupled and, resultingly, the power-up control circuit 40 to achieve a desired result.

For example, after power-up is achieved by the power-up control circuit 40, feedback loop 42 can cause its associated coupled circuit 32b or 36b respectively, to exert control over the power-up control circuit 40. Such control, in a preferred embodiment, is provided to ensure that once power-up is initiated responsive to input from the first and second circuits 32b, 36b, changes in the first or second circuit do not affect the power-up state which is present at the output of the power-up control circuit. For example, once power-up has been initiated or achieved, one of the first or second circuits 32b, 36b can cause the power-up control circuit to go offline, so-to-speak, so that downstream operations are not affected by further operations of the power-up control circuit 40.

Figure 5:
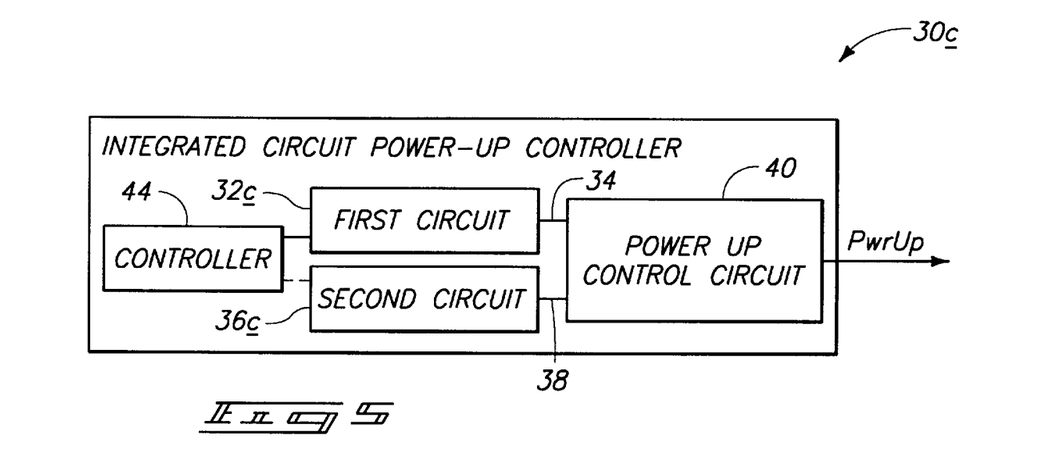
FIG. 5 is a high level block diagram of an integrated circuit power-up controller in accordance with another embodiment of the invention.

Referring to FIG. 5, an integrated circuit power-up controller in accordance with another embodiment is shown generally at 30c. Like numerals from the above-described embodiments have been utilized where appropriate, with differences being indicated by the suffix "c" or with different numerals. Here, first and second circuits 32c, 36c are provided and are operably coupled with power-up control circuit 40. A circuit controller 44 is provided and is operably coupled with one of the first and second circuits 32c, 36c, respectively. In this embodiment, circuit controller 44 is configured to preclude a state change in one of the first and second circuits 32c, 36c, from affecting the power-up control circuit 40 after initiation of power-up. Specifically, and because of the nature of the power-up control circuit as a state-dependent element, power-up is initiated after a predetermined state has been achieved at its two inputs (coinciding with outputs 34, 38). After initiation of power-up, a state change at one of the inputs of power-up control circuit 40 could affect operation of downstream integrated circuitry. By providing a controller 44 operably coupled with at least one of the first and second circuits 32c, 36c, measures can be taken to ensure that appropriate control is exerted over the circuit to prevent a state change from promulgating itself to the power-up control circuit 40.

Figure 6:
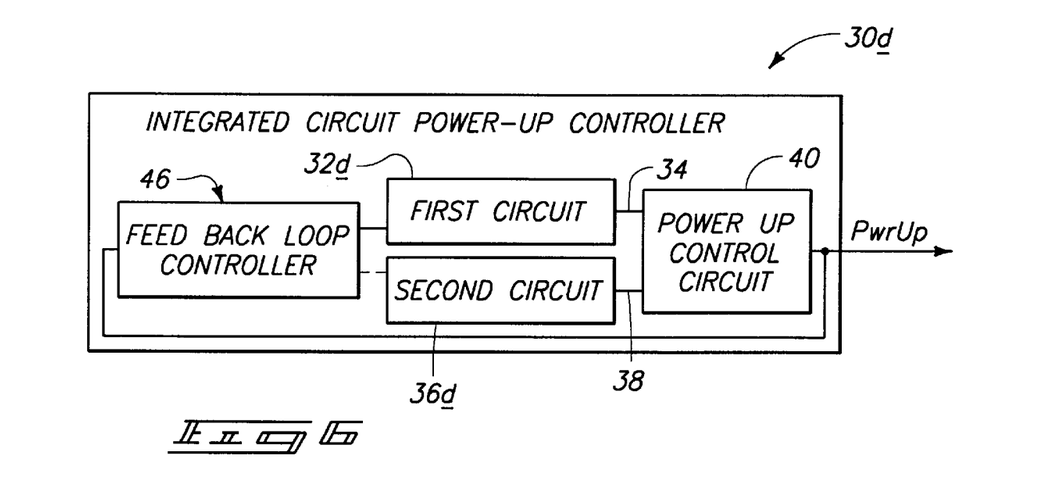
FIG. 6 is a high level block diagram of an integrated circuit power-up controller in accordance with another embodiment of the invention.

Referring to FIG. 6, an integrated circuit power-up controller in accordance with another embodiment of the invention is shown generally at 30d. Like numerals from the above-described embodiments have been utilized where appropriate, with differences being indicated by the suffix "d" or with different numerals. Here, first and second circuits 32d, 36d respectively are provided. A feedback loop controller 46 is provided and operably couples power-up control circuit 40 with one of the first and second circuits 32d, 36d respectively. The feedback loop controller is configured to provide feedback in a manner which exerts control over the power-up circuit 40, and to preclude a state change in one of the first and second circuits 32d, 36d from affecting the power-up control circuit after initiation of power-up. Specifically, feedback loop controller 46 provides feedback in a manner which is similar to that which was described in connection with FIG. 4. In addition, functionality is provided by feedback loop controller 46 such that a state change in one of the first and second circuits does not affect the power-up control circuit after initiation of power-up.

Figure 7:
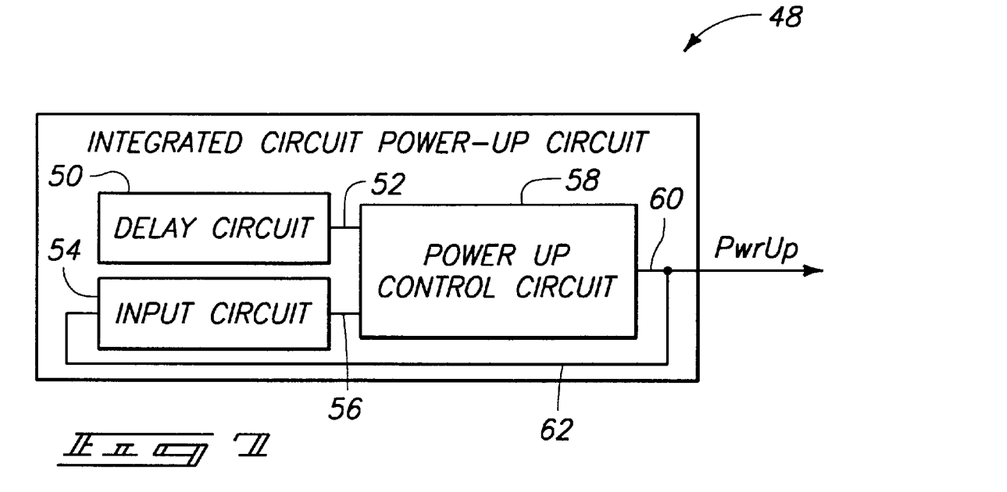
FIG. 7 is a high level block diagram of an integrated circuit power-up circuit in accordance with one embodiment of the invention.

Referring to FIG. 7, an integrated circuit power-up circuit in accordance with another embodiment of the invention is shown generally at 48. Circuit 48 includes a delay circuit 50 configured to provide a delayed output 52. An input circuit 54 is provided having an output 56. A power-up control circuit 58 is provided having inputs which are coupled respectively with the outputs 52, 56 of delay circuit 50 and input circuit 54 respectively. Power-up control circuit 58 has an output line 60 which can assume a plurality of power-up states. A feedback control loop 62 operably connects power-up control circuit output line 60 and input circuit 54 such that operational aspects of the input circuit can be controlled by the power-up control circuit responsive to the power-up states present on output line 60.

Figure 8:
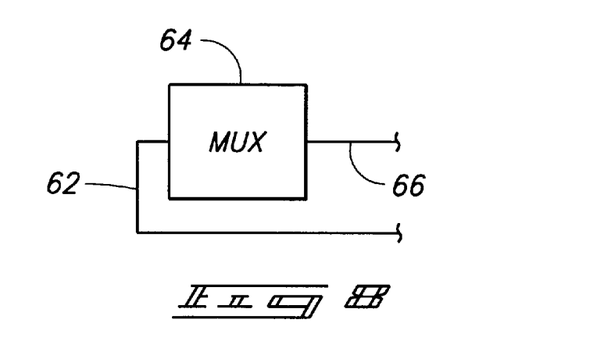
FIG. 8 is an isolated block diagram of an exemplary input circuit in accordance with one embodiment of the invention.

Referring to FIG. 8, and in accordance with one embodiment of the invention, input circuit 54 (as in FIG. 7, for example) comprises a multiplexer 64 having a multiplexed output 66 which is dependent on the power-up states present on output line 60. The multiplexer receives, as one or more inputs, the output from output line 60. This output, as will become apparent below, and in accordance with one embodiment, comprises the power-up state and the inverse of the power-up state.

Figure 9:
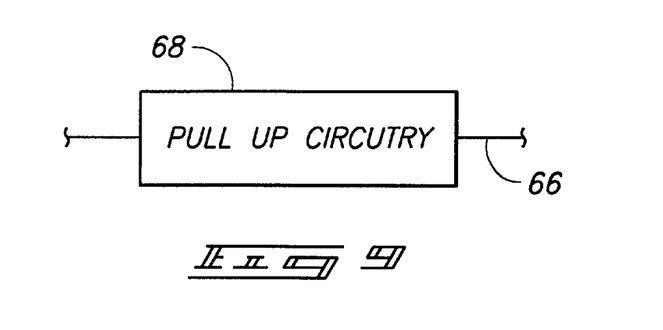
FIG. 9 is an isolated block diagram of an exemplary input circuit in accordance with another embodiment of the invention.

Referring to FIG. 9, and in accordance with another embodiment of the invention, input circuitry 54 comprises pull-up circuitry 68 which is configured to maintain a power-up control circuit input, such as inputs corresponding to outputs 52, 56 (FIG. 7), at a desired state. In a preferred embodiment, pull-up circuitry 68 is configured to maintain a power-up control circuit input at a desired state after a state change on output line 60 of power-up control circuit 58.

Figures 10, 11:
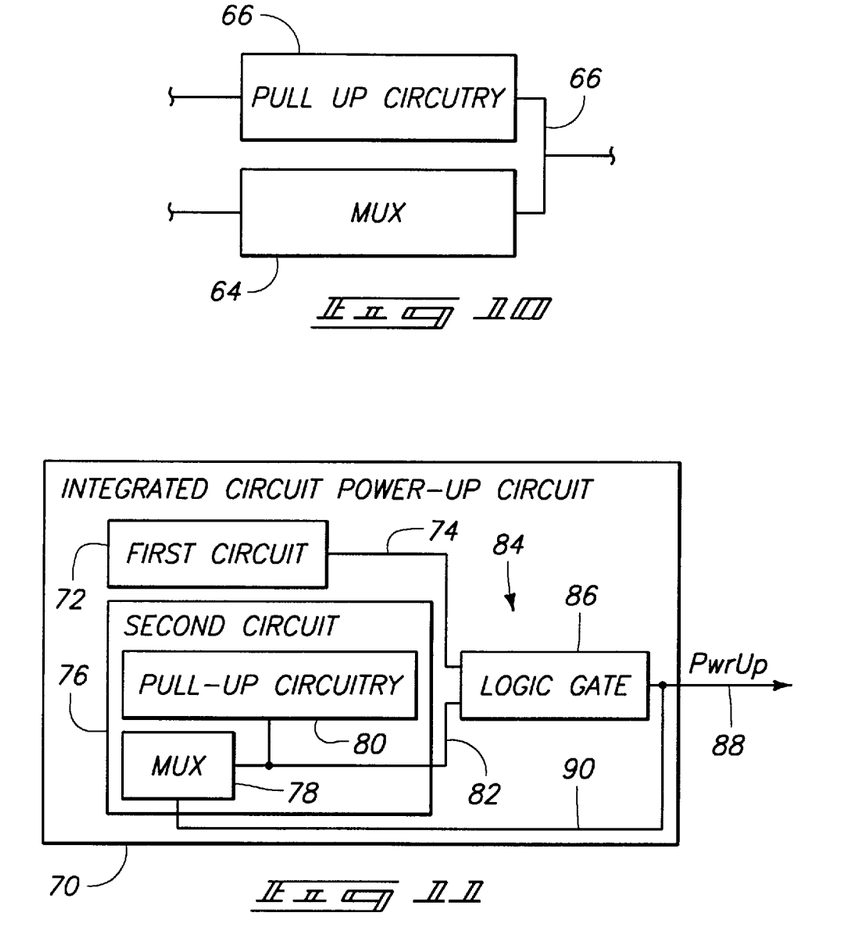
FIG. 10 is an isolated block diagram of an exemplary input circuit in accordance with another embodiment of the invention.
FIG. 11 is a high level block diagram of an integrated circuit power-up circuit in accordance with one embodiment of the invention.
Figure 11:
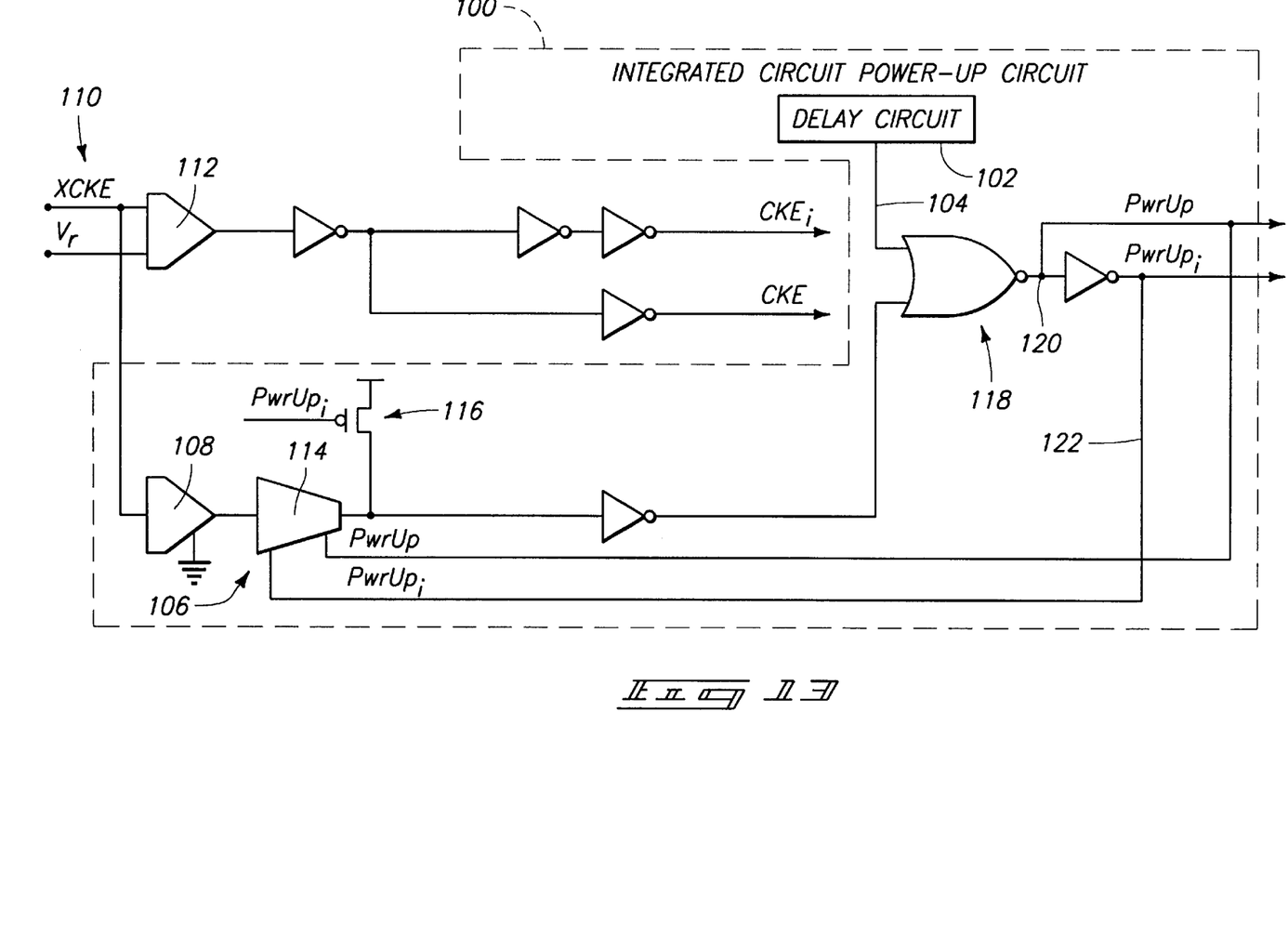

Referring to FIG. 10, and in accordance with another embodiment of the invention, input circuit 54 comprises a multiplexer 64 having a multiplexed output 66 dependent on the power-up states of output line 60 (FIG. 7). In addition, input circuit 54 comprises pull-up circuitry 66 operably coupled with multiplexer 64 and configured to maintain a power-up control circuit input at a desired state. In a preferred embodiment, the pull-up circuitry of FIG. 10 is configured to maintain a power-up control circuit input at a desired state after a state change on output line 60 (FIG. 7) of power-up control circuit.

In one embodiment, input circuit 54 comprises a clock circuit such as that described above with respect to the other embodiments. In another embodiment, power-up control circuit 58 is preferably configured to initiate power-up by changing a state of its output line 60, after receiving predefined outputs from delay circuit 50 and input circuit 54.

Referring to FIG. 11, an integrated circuit power-up circuit in accordance with another embodiment of the invention is shown generally at 70 and includes a first circuit 72 having an output 74. A second circuit 76 is provided and comprises a multiplexer 78 and pull-up circuitry 80 connected therewith. Second circuit 76 includes an output 82. Logic circuitry 84 is provided which, in this example, comprises a logic gate 86 for controlling power-up states of power-up circuit 70. Logic gate 86 preferably includes a plurality of inputs which are coupled with outputs 74, 82 of first and second circuits 72, 76 respectively. Logic gate 86 includes an output 88. A feedback loop 90 connects output 88 of logic gate 86 with multiplexer 78 as shown. The feedback loop, although illustrated as a single connection, can comprise more than one input to the multiplexer, e.g. power-up and inverse power-up states. Logic gate 86 is preferably configured to initiate one power-up state in accordance with a predefined condition at its input. After initiation of power-up, multiplexer 78 and pull-up circuitry 80 are configured to maintain an input of logic gate 86 as will become apparent below.

In one embodiment, first circuit 72 comprises a delay circuit such as those described above with respect to the other embodiments. In another embodiment, second circuit 76 comprises a clock circuit such as those described above in connection with the other embodiments. In another embodiment, feedback loop 90 comprises two different lines which are connected with multiplexer 78. A first line comprises a power-up line and a second line comprises the inverse of the power-up line. As an example, where the power-up line assumes a logic 1, the power-up inverse line would assume a logic 0. In one embodiment, pull-up circuitry 80 comprises a transistor gate which is tied to one of the power-up line or power-up inverse line. The transistor gate is operable to turn on its associated transistor and, accordingly, pull up the node corresponding to output 82 to a desired voltage. This maintains an input to logic gate 86 at a desired level upon initiation of power-up. In this example, initiation of power up comprises a logic 1 which is present at the output of logic gate 86, responsive to the presentation of the desired inputs on lines 74, 82.

Referring to FIG. 13, an exemplary integrated circuit power-up circuit, in accordance with one embodiment of the present invention is shown generally at 100. The power-up circuit described just below is particularly useful in the context of DRAM circuitry, and specifically DDR synchronous DRAMs. A first circuit or delay circuit 102 is provided and has an output 104. A second circuit 106 is provided and includes a TTL input buffer 108 which is connected, in parallel, with a CKE input buffer shown generally at 110. The illustrated CKE input buffer 110 includes a two-input, SSTL input buffer 112 which uses a reference voltage $V_r$ to determine $V_{IH}/V_{IL}$. A clock signal XCKE is fed into both the SSTL input buffer 112 and the TTL input buffer 108. Buffer 108 is coupled with a multiplexer 114. A weak p-channel pull-up transistor is provided generally at 116 and has its gate controlled by the power-up inverse line (in this example designated as "PwrUp$_i$"). The output of multiplexer 114 is provided to the input of a NOR gate 118. In this example, NOR gate 118 has two inputs, one of which is provided by delay circuit 102, the other of which is provided by the output from multiplexer 114 as shown. NOR gate 118 has an output 120 comprising a power-up line. Power-up line 120 is inverted to provide a power-up inverse line 122. Both the power-up line 120 and the power-up inverse line 122 are used to provide feedback to multiplexer 114 as shown. Accordingly, the multiplexer 114 and pull-up transistor 116 are controlled by the feedback of the power-up circuit which is presented along lines 120 and 122. Normally, in the illustrated circuit, power-up is a function of not only the delay provided by delay circuit 102, but also the state of CKE which is present at the input of the NOR gate 118 provided by multiplexer 114. When both conditions at the NOR gate inputs are satisfied, the power-up circuit fires high, or turns on, and feedback to multiplexer 114 along lines 120, 122, and provision of the power-up inverse line to p channel transistor 116 is provided thereby shutting off the CKE input from changing states into the power-up circuit. Essentially, the desired input from delay circuit 102 will be seen by the NOR gate as being low. The input from multiplexer 114, as seen by NOR gate 118 will be the inverse of CKE. Accordingly, when CKE goes high, as it will do after the predetermined period of time has elapsed, the signal which is received at the NOR gate input is low. With two low signals, the NOR gate goes high thereby achieving a high power-up state. When the power-up line 120 is high, the power-up inverse line 122 is low. Accordingly, p-channel pull-up transistor 116 is turned on thereby maintaining the input from multiplexer 114 which is provided to NOR gate 118 at a constant state. Accordingly, this shuts off the CKE input from changing states into the power-up circuit.

Figure 12:
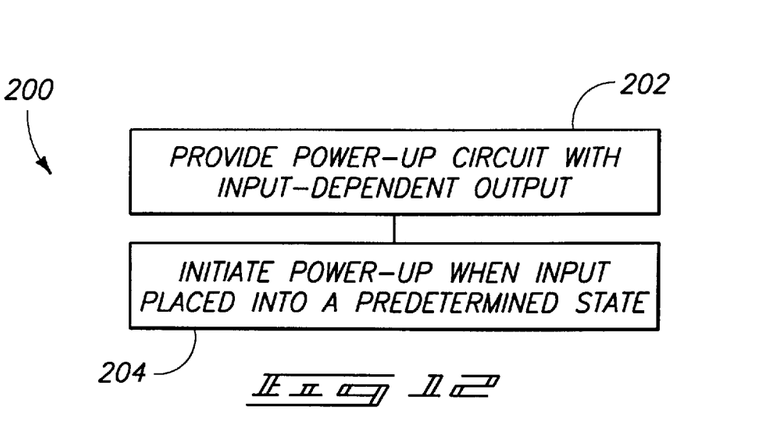
FIG. 12 is a flow diagram which describes one embodiment of an integrated circuit power-up method in accordance with one embodiment of the invention.

Referring to FIG. 12, an integrated circuit power-up method is illustrated generally at 200 and includes at 202 providing a power-up circuit having an output which is dependent upon input from both a delay circuit and an input circuit. At 204, power-up is initiated through the output of the power-up circuit when the inputs from the delay circuit and the input circuit are placed into a predetermined state. In one embodiment, the power-up circuit comprises a logic gate. In another embodiment, the input circuit comprises a clock circuit. In yet another embodiment, the input circuit comprises a multiplexer which is multiplexed by the power-up circuit through a feedback loop. The multiplexer is preferably configured to preserve an input state of the power-up circuit. In another embodiment, the input circuit comprises pull-up circuitry controlled by the power-up circuit. The pull-up circuitry is preferably configured to place a predetermined state at one of the inputs of the power-up circuit after power-up has been initiated.

In yet another embodiment, a power-up circuit is provided having an output which is dependent upon input from one circuit. A feedback control loop is provided and operably connects the power-up circuit output and the one circuit. The feedback control loop controls operational aspects of the one circuit responsive to the output of the power-up circuit. In one embodiment, power-up is initiated through the power-up circuit after the one circuit has satisfied a predefined operational parameter. In another embodiment, a second circuit is provided and is operably connected with the power-up circuit. The output of the power-up circuit is preferably dependent upon input from the second circuit. In another embodiment, power-up is initiated through the power-up circuit after the one circuit has satisfied a predefined operational parameter. Additionally, after initiating power-up and using the one circuit, a desired input is maintained to the power-up circuit. In a preferred embodiment, maintenance of the desired input to the power-up circuit comprises providing pull-up circuitry configured to provide a potential sufficient to provide the desired input to the power-up circuit.

In another embodiment, an integrated circuit power-up method comprises initiating power-up of an integrated circuit only after a state transition of a clock control input pin.

Figure 14:
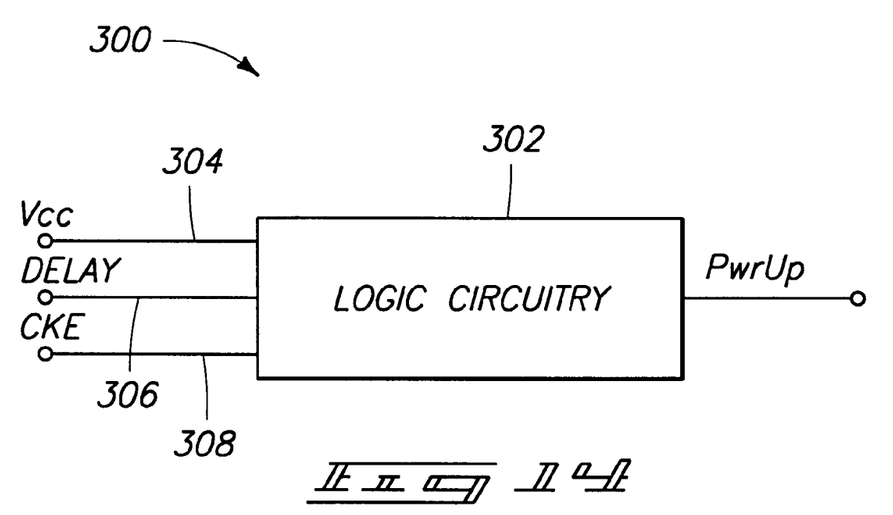
FIG. 14 is a high level block diagram of an alternate embodiment of the present invention.

Referring to FIG. 14, aspects of another embodiment of the present invention are shown generally at 300. There, logic circuitry 302 is provided. Logic circuitry 302 includes a plurality of inputs which, in this example, constitute a Vcc input 304, a delay input 306, and a clock input CKE 308. Up to now, power-up has been shown to be dependent upon only two inputs from exemplary first and second circuits. It will be appreciated, however, that power-up of the desired integrated circuitry can be dependent upon more than two inputs. In this example, three such inputs are shown. Logic circuitry 302 can be suitably configured to define a set of conditions which must be satisfied before power-up is initiated. In this example, the additional input of a voltage Vcc is provided which, accordingly, enables power-up to be controlled by more than just delay circuitry, as in input 306, and clock circuitry, as in input 308.

Advantages of the various embodiments of the present invention provide predictability in circuit operation in that initiation of power-up can be conditioned on the satisfaction of various conditions. Such is particularly useful in the context of DRAM circuitry.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An integrated circuit power-up controller comprising:
    a first circuit having an output;
    a second circuit having an output; and
    a state-dependent, power-up control circuit having two inputs which are coupled respectively with the outputs of the first and second circuits, the state-dependent, power-up control circuit being configured to initiate power-up of a desired circuit after a respective predetermined state has been individually achieved at the two inputs.

2. The integrated circuit power-up controller of claim 1, wherein one of the first and second circuits comprises a delay circuit.

3. The integrated circuit power-up controller of claim 1, wherein one of the first and second circuits comprises a clock circuit.

4. The integrated circuit power-up controller of claim 1, wherein one of the first and second circuits comprises a delay circuit, and the other of the first and second circuits comprises a clock circuit.

5. The integrated circuit power-up controller of claim 1 further comprising a feedback loop operably coupling the power-up control circuit and one of the first and second circuits, the feedback loop being configured to affect certain operational aspects of the circuit with which it is coupled.

6. The integrated circuit power-up controller of claim 1 further comprising a circuit controller operably coupled with one of the first and second circuits, the circuit controller being configured to preclude a state change in said one of the first and second circuits from affecting the power-up control circuit after initiation of power-up.

7. The integrated circuit power-up controller of claim 1 further comprising a feedback loop controller operably coupling the power-up control circuit and one of the first and second circuits, the feedback loop controller being configured to preclude a state change in said one of the first and second circuits from affecting the power-up control circuit after initiation of power-up.

8. An integrated circuit power-up circuit comprising:
    a delay circuit configured to provide a delayed output;
    an input circuit having an output;
    a power-up control circuit having inputs which are coupled respectively with the outputs of the delay circuit and the input circuit, the power-up control circuit having an output line which can assume a plurality of power-up states; and
    a feedback control loop operably connecting the power-up control circuit output line and the input circuit, wherein operational aspects of the input circuit can be controlled by the power-up control circuit responsive to said power-up states.

9. The integrated circuit power-up circuit of claim 8, wherein the input circuit comprises a multiplexer having a multiplexed output dependent on the power-up states.

10. The integrated circuit power-up circuit of claim 8, wherein the input circuit comprises pull-up circuitry configured to maintain a power-up control circuit input at a desired state.

11. The integrated circuit power-up circuit of claim 8, wherein the input circuit comprises pull-up circuitry configured to maintain a power-up control circuit input at a desired state after a state change on the output line of the power-up control circuit.

12. The integrated circuit power-up circuit of claim 8, wherein the input circuit comprises:
    a multiplexer having a multiplexed output dependent on the power-up states; and
    pull-up circuitry operably coupled with the multiplexer and configured to maintain a power-up control circuit input at a desired state.

13. The integrated circuit power-up circuit of claim 8, wherein the input circuit comprises:
   a multiplexer having a multiplexed output dependent on the power-up states; and
   pull-up circuitry operably coupled with the multiplexer and configured to maintain a power-up control circuit input at a desired state after a state change on the output line of the power-up control circuit.

14. The integrated circuit power-up circuit of claim 8, wherein the input circuit comprises a clock circuit.

15. The integrated circuit power-up circuit of claim 8, wherein the power-up control circuit is configured to initiate power-up by changing a state of its output line after receiving predefined outputs from the delay circuit and the input circuit.

16. The integrated circuit of claim 15, wherein the input circuit comprises a clock circuit.

17. An integrated circuit power-up circuit comprising:
   a first circuit having an output;
   a second circuit comprising a multiplexer and pull-up circuitry connected therewith, the second circuit having an output;
   a logic gate for controlling power-up states of the power-up circuit, the logic gate having a plurality of inputs which are coupled with the outputs of the first and second circuits, and an output; and
   a feedback loop connecting the output of the logic gate with the multiplexer,
   wherein the logic gate is configured to initiate one power-up state in accordance with a predefined condition at its inputs, and wherein after initiation of power-up, the multiplexer and the pull-up circuitry are configured to maintain an input of the logic gate.

18. The integrated circuit power-up circuit of claim 17, wherein the first circuit comprises a delay circuit.

19. The integrated circuit power-up circuit of claim 17, wherein the second circuit comprises a clock circuit.

20. The integrated circuit power-up circuit of claim 17, wherein the feedback loop comprises a power-up line and a power-up inverse line.

21. The integrated circuit power-up circuit of claim 17, wherein the output of the logic gate comprises a power-up line and a power-up inverse line, and further wherein the pull-up circuitry comprises a gate which is tied to one of the power-up line or power-up inverse lines.

22. A dynamic random access memory (DRAM) power-up circuit comprising:
   a power-up controller having plural inputs, the power-up controller being configured to power-up DRAM circuitry responsive to receiving pre-determined inputs at the plural inputs;
   a delay circuit having an output coupled with one of the plural inputs; and
   another circuit having an output coupled with another of the plural inputs.

23. The dynamic random access memory power-up circuit of claim 22, wherein the another circuit comprises a clock circuit.

24. The dynamic random access memory power-up circuit of claim 22, wherein the power-up controller comprises a two-input power-up controller.

25. The dynamic random access memory power-up circuit of claim 22, wherein the power-up controller comprises a three-input power-up controller, and further comprising an additional circuit having an output coupled with a third input of the power-up controller.

26. The dynamic random access memory power-up circuit of claim 22, wherein the power-up controller comprises a three-input power-up controller, and further comprising an additional circuit having an output coupled with a third input of the power-up controller, and wherein the another circuit comprises a clock circuit.

27. The dynamic random access memory power-up circuit of claim 22, wherein the power-up controller comprises a three-input power-up controller, and further comprising an additional circuit having an output coupled with a third input of the power-up controller, the additional circuit output comprising a Vcc voltage, and wherein the another circuit comprises a clock circuit.

28. An integrated circuit power-up method comprising:
   providing a power-up circuit having an output which is dependent upon input from both a delay circuit and an input circuit; and
   initiating power-up through the output of the power-up circuit when the inputs from the delay circuit and the input circuit are placed into a predetermined state.

29. The power-up method of claim 28, wherein the power-up circuit comprises a logic gate.

30. The power-up method of claim 28, wherein the input circuit comprises a clock circuit.

31. The power-up method of claim 28, wherein the input circuit comprises a multiplexer which is multiplexed by the power-up circuit through a feedback loop, and wherein the multiplexer is configured to preserve an input state of the power-up circuit.

32. The power-up method of claim 28, wherein the input circuit comprises pull-up circuitry controlled by the power-up circuit, the pull-up circuitry being configured to place a predetermined state at one of the inputs of the power-up circuit after power-up has been initiated.

33. An integrated circuit power-up method comprising:
   providing a power-up circuit having an output which is dependent upon input from one circuit; and
   providing a feedback control loop operably connecting the power-up circuit output and said one circuit, the feedback control loop controlling operational aspects of said one circuit responsive to the output of the power-up circuit.

34. The power-up method of claim 33 further comprising initiating power-up through the power-up circuit after said one circuit has satisfied a predefined operational parameter.

35. The power-up method of claim 33 further comprising providing a second circuit operably connected with the power-up circuit, the output of the power-up circuit being dependent upon input from the second circuit.

36. The power-up method of claim 33 further comprising:
   initiating power-up through the power-up circuit after said one circuit has satisfied a predefined operational parameter; and
   after initiating power-up and using said one circuit, maintaining a desired input to the power-up circuit.

37. The power-up method of claim 36, wherein said maintaining comprises providing pull-up circuitry configured to provide a potential sufficient to provide said desired input to the power-up circuit.

* * * * *